(12) United States Patent
Walter et al.

(10) Patent No.: US 6,243,035 B1
(45) Date of Patent: Jun. 5, 2001

(54) KEY MODULE FOR WIRELESS KEYBOARD

(75) Inventors: Ronald J. Walter, Anaheim; John D. Dent, Claremont, both of CA (US)

(73) Assignee: Universal Electronics Inc., Cypress, CA (US)

( * ) Notice: Subject to any disclaimer, the term of this patent is extended or adjusted under 35 U.S.C. 154(b) by 0 days.

(21) Appl. No.: 09/032,734

(22) Filed: Feb. 27, 1998

(51) Int. Cl.$^7$ .................................................. G08C 19/12
(52) U.S. Cl. ........................ 341/176; 341/173; 341/20; 341/22
(58) Field of Search .................................. 341/173, 176, 341/20, 22; 345/327; 340/825.56, 825.69; 348/466, 565; 364/188

(56) References Cited

U.S. PATENT DOCUMENTS

| | | | |
|---|---|---|---|
| 3,940,758 | * 2/1976 | Margolin | 341/22 |
| 4,549,179 | * 10/1985 | Stendardo | 340/825.69 |
| 4,626,847 | * 12/1986 | Zato | 340/825.56 |
| 4,939,514 | * 7/1990 | Miyazaki | 341/22 |
| 5,329,370 | * 7/1994 | Yazolino | 548/734 |
| 5,602,597 | * 2/1997 | Bertram | 348/565 |
| 5,774,063 | * 6/1998 | Berry | 340/825.69 |
| 5,844,552 | * 12/1998 | Gaughan | 345/327 |
| 5,850,340 | * 12/1998 | York | 364/188 |
| 5,865,546 | * 2/1999 | Ganthier | 400/489 |

* cited by examiner

Primary Examiner—Michael Horabik
Assistant Examiner—Albert K. Wong
(74) Attorney, Agent, or Firm—Mark R. Galis; John E. Hyatt

(57) ABSTRACT

A self-contained module including finger depressible keys, said module being mountable on, and useable with, a wireless keyboard for a computer. The module includes a pre-programmed microcontroller for controlling basic functions of the TV and an associated VCR via an IR LED on the keyboard.

15 Claims, 5 Drawing Sheets

KEY MODULE FOR WIRELESS KEYBOARD

BACKGROUND OF THE INVENTION

One of the interesting technologies presently being developed is focused on combining the Internet or World Wide Web with the standard television set, video cassette recorder ("VCR") and other home and office electronic products. Surveys show that almost 90% of U.S. homes have television sets, and most homes have more than one set. Various companies have developed and are selling products to create Internet sites that are fully compatible with the technology; these sites will allow customers full access to the Internet via their television set. It has been observed that the challenge to universal acceptance of the World Wide Web is, in fact, the television set (TV).

To utilize the emerging Web-to-TV technology, standard computer keyboards having wires have been used. Keyboards have long been popular as PC (personal computer) accessories such as for this application. Companies which offer Internet access, using the user's TV as the display device, usually offer either corded or cordless keyboards. A user can use the keyboard for various Internet functions including the sending of e-mail (electronic mail). However, for a variety of reasons, infrared (IR) wireless keyboards which have a range of up to 30 feet appear to be the preferred structure for interfacing with a home TV. Thus, a user merely needs a wireless keyboard, the TV, a phone line, and the Internet access service or Internet terminal to conveniently utilize this new technology. It has been found that a desirable feature for the user of a cordless keyboard is to be able to turn on his TV, VCR or cable box, make adjustments to the volume, and make adjustments to other functions thereof, directly from the keyboard without having to set the keyboard down and pick up the TV remote control.

Presently, in order for a keyboard manufacturer to offer this capability, the manufacturer has to contract with an IR database owner to obtain an IR code library for TV control, modify his firmware and/or hardware inside the keyboard to support the TV control signal transmission, and either add keys to the keyboard or assign additional functions to the existing keyset to allow the user to access these functions. This is time consuming, inefficient and presents a range of technical problems. The present invention addresses the problems outlined above by providing a self-contained module that is available as a standard component and is mountable on a standard keyboard housing with only minimal changes, if any, to the plastic tooling of the housing.

SUMMARY OF THE INVENTION

A self-contained universal and standardized module is mountable on, and is used in conjunction with a wireless keyboard for computer control of a TV, VCR or other consumer electronic products. A standard keyboard can be minimally modified to accommodate mounting of the module thereon and to electronically connect to the circuitry of the keyboard. A microcontroller within the module is programmed for controlling basic functions of a TV and VCR via the IR LED (light emitting diode) output of the keyboard.

The foregoing features and advantages of the present invention will be apparent from the following more particular description of the invention. The accompanying drawings, listed hereinbelow, are useful in explaining the invention.

DESCRIPTION OF THE INVENTION

Figure 1:
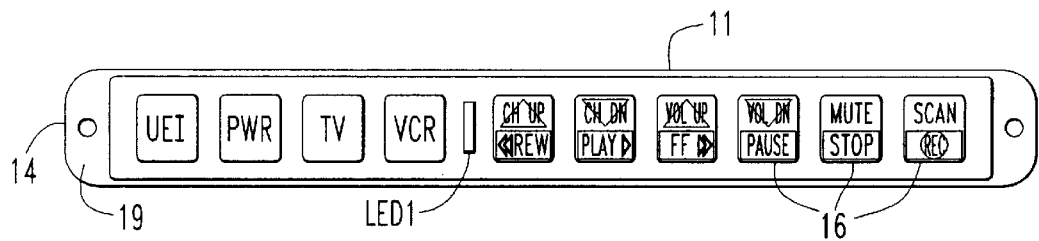
FIG. 1 is a top view of the inventive module.
Figure 2:
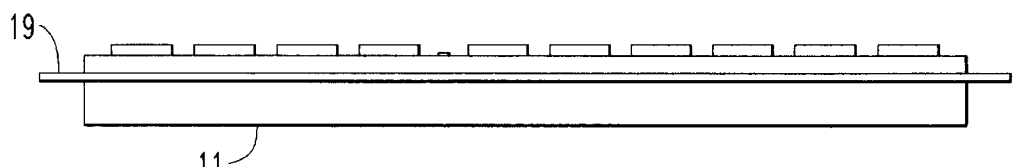
FIG. 2 is a side view of the module of FIG. 1.
Figure 3:
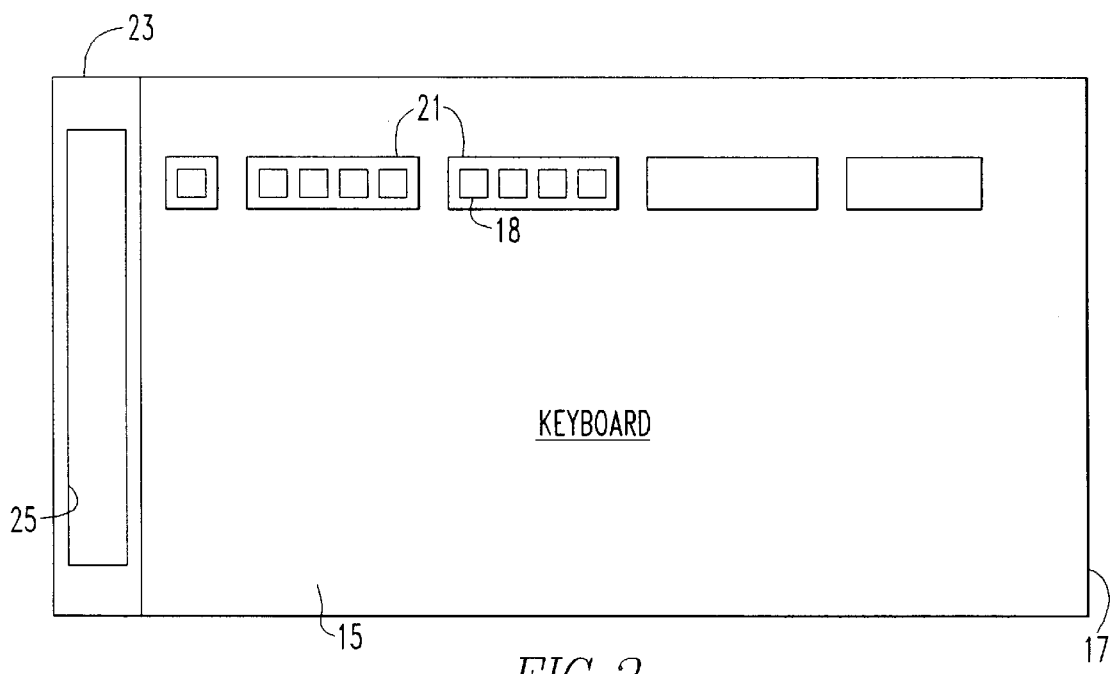
FIG. 3 depicts a minimally modified standard keyboard in which the module is mounted.

FIG. 1 is a top view of the inventive key module 11 that includes a pre-programmed microcontroller containing a universal TV and VCR library, together with a key pad, generally labeled as 16, and all necessary support circuitry. It should be understood that although this particular embodiment controls TV and VCR, other devices may also be included in other versions, e.g. TV and cable or even TV, VCR and cable, etc. The modular mechanical package is approximately 5.5 inches in length and 0.5 inches in width. Module 11 is mountable on a standard computer type keyboard 15 with a base or housing 17. FIG. 3 is an outline of a modified standard keyboard plastic housing 17 for the keyboard 15, showing keys 18 mounted in respective recesses 21, as is well known. For purpose of clarity in the drawing, only a few of the keyboard keys 18 are specifically shown. In a first embodiment of the invention, the mold (not shown) for a standard keyboard base 17 is modified to include an outwardly extending portion such as indicated by the numeral 23. A recess 25 in extending portion 23 receives the module 11. Holes 14 on the ends of flanges 19 of the module 11, see FIG. 2, receive suitable securing screws, not shown. Portion 23 for the plastic housing 17 can be formed on any part of the housing basically dependent on ease of modifying the keyboard mold and on the attractiveness of design.

Figure 4:
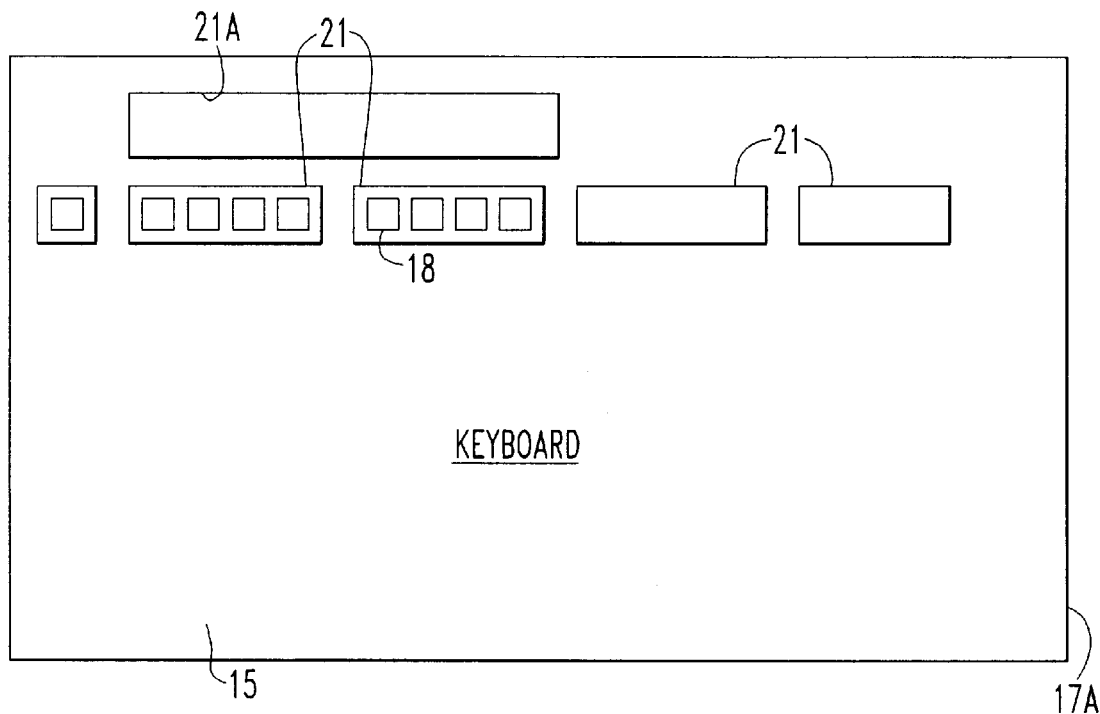
FIG. 4 depicts another modified keyboard in which the module may be mounted.

In a second embodiment of the invention a housing 17A is molded to include a recess 21 A on its surface such as along the upper edge as shown in FIG. 4. The module 11 is located and positioned in recess 21A.

Figure 5:
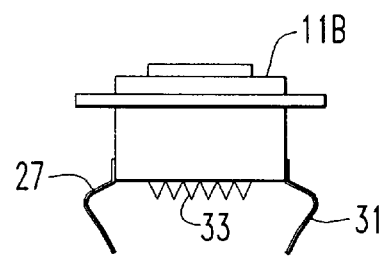
FIG. 5 depicts a modification of the module housing for mounting on a keyboard with an essentially unmodified housing.

Another embodiment of the module 11B is indicated in FIG. 5 which is an end view of the device. This embodiment is particularly applicable for retrofitting purposes. In FIG. 5 module 11C is constructed to include extensions 27 that extend outwardly from each side of the module. Extensions 27 include downwardly depending spring clip arms 31. On installation of the module 11B on a housing similar to housing 17A, but without the recess 21A, the module is positioned on the top surface of the housing and the clip arms 31 are positioned (clipped-on) to engage an edge of a recess 21 and the side of the housing. Velcro(R) adhesive material 33 is used to further adhere the module 11 to the keyboard housing 17A. (The Velcro (R) pad for the keyboard surface is not shown). The module 11 may be purchased from the manufacturer or seller of the keyboard 15 and mounted such as described above, or by other suitable means.

Figures 6, 7:
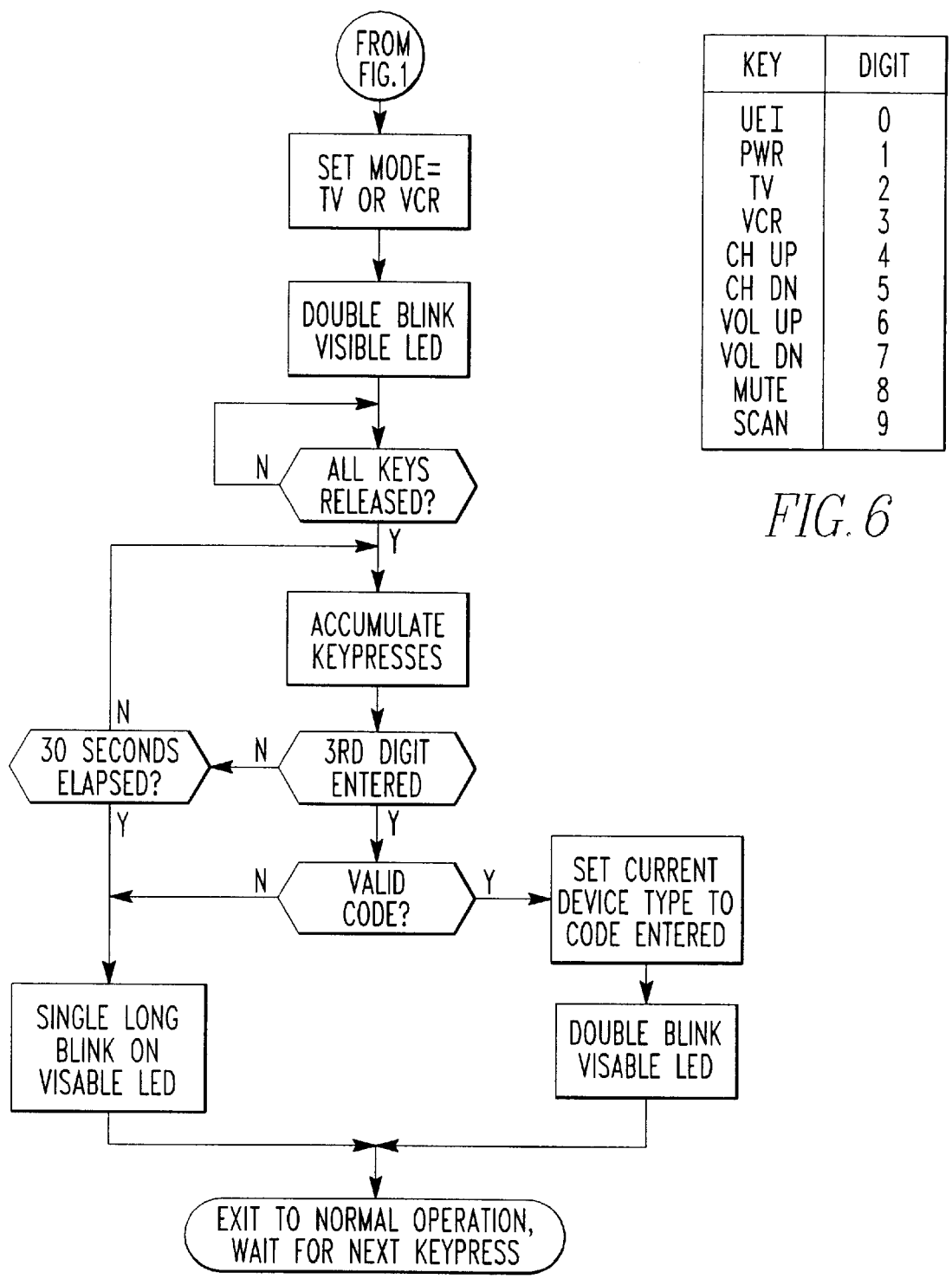
FIG. 6 is a listing of the key interpretation during digit entry.
FIG. 7 is a flow chart showing the functional overview of the module.
Figure 8:
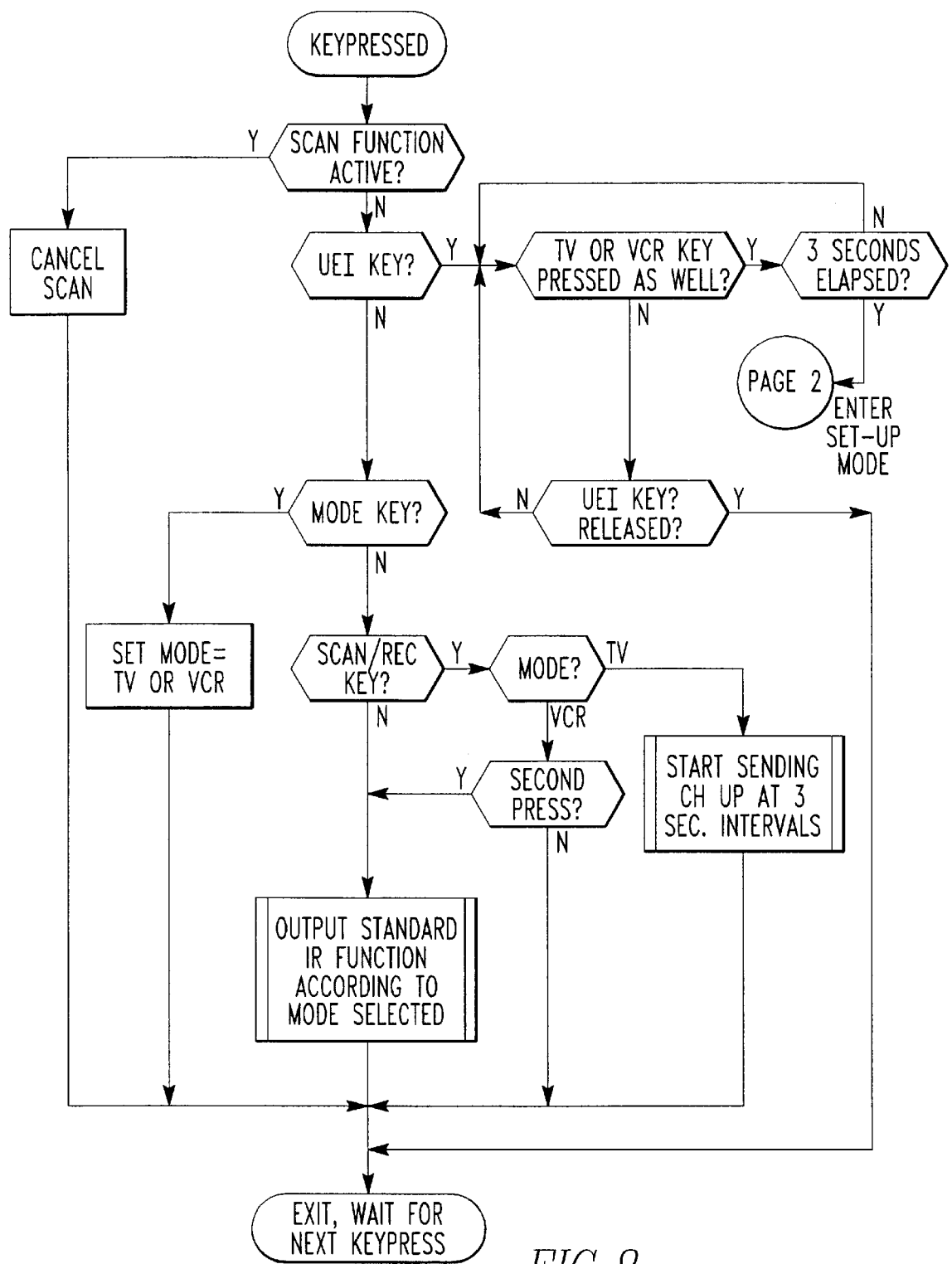
FIG. 8 is a flow chart of the device code set-up function of the module.

Referring back to FIGS. 1 and 2, module 11 includes a number of finger actuatable keys 16 that are depressed to enter selected desired basic functions or commands for the television set, as listed in FIG. 6. The keys 16 provide the basic commands to control the TV and the VCR, as indicated in FIGS. 6, 7 and 8.

Figure 9:
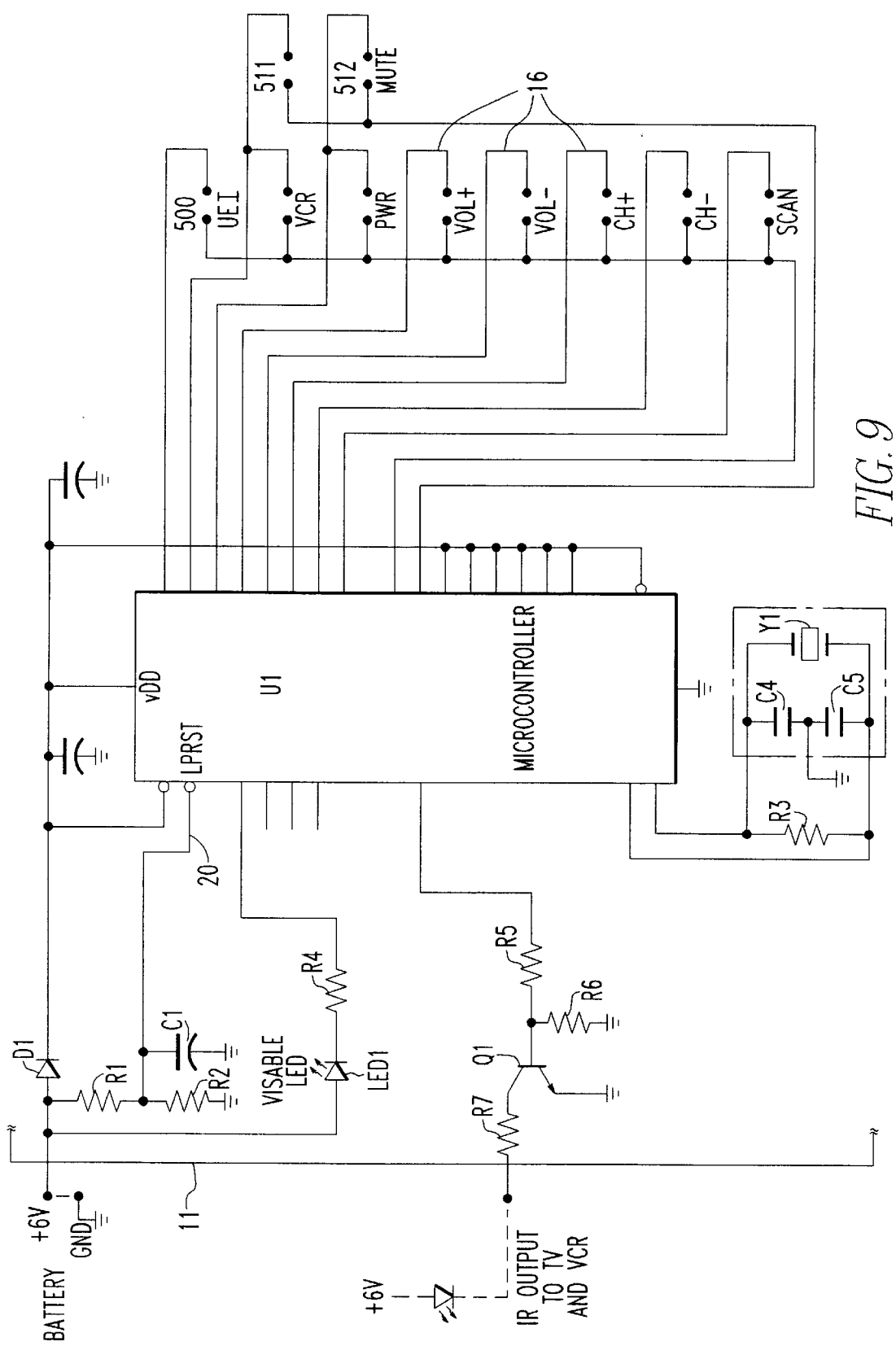
FIG. 9 shows the electronic circuitry of the module including the microcontroller.

Referring briefly to FIG. 9, the module 11 requires only two connections to the keyboard electronics. One connection is for obtaining power from the keyboard's existing battery power source, and the other connection to communicate through an IR device mounted within the keyboard. The IR output may alternatively be connected to an IR LED dedicated for the purpose of TV control.

Device selection keys "TV" and "VCR" (see FIGS. 1 and 6) are used to indicate which of the two devices is to be operated. Once a device type has been selected by pressing the appropriate key, as depicted in the flow diagrams of FIGS. 7 and 8, the module remains in that mode until the device type is explicitly changes by pressing the other device key. The standard keys labeled: PWR (power), CH (channel), UP/REW (re-wind), CH DN (down), etc. send the indicated function to the selected device.

For those keys that are double labeled (e.g. mute/stop) the first function is sent when the remote module is in the TV mode, and the second function is sent when the module is in the VCR mode. In the TV mode, the special keys, SCAN/REC initiate an automatic scan through the channels available on the TV set, by sending the CH UP command at regular intervals. The progression is stopped by pressing the SCAN/REC or any other key again, as known in the art. In the VCR mode, this key sends the "Record" command, after it has been pressed twice in succession.

The key labeled UEI is used during device set up as will now be described. Before first use of the module 11, and also after the batteries have been removed from the keyboard, the user must indicate which brand and type of TV and VCR devices he wishes to control. This is done by entering into the module, a 3-digit code number corresponding to the desired device brand, from a listing in the user manual.

Refer now to the flow diagrams of FIGS. 7 and 8. First, the "UEI" key is pressed concurrently with one of the "TV" or "VCR" keys, and held for 3 seconds to set the particular device. At the end of this period, the visible LED (LED1) flashes twice to indicate that the module has entered the device setup mode. Once in this mode, and upon release of the two keys (UEI key and the activated one of the TV or VCR key), the control software in the module will interpret the ten keys on the keypad as representing the digits 0through 9, see FIG. 6. Using these keys, the user now may enter the desired 3-digit code number. If the number entered is a valid device number, the visible LED blinks twice to confirm the entry. If the number entered is invalid, or if the entry is not completed within 30 seconds, the visible LED 227 emits one long blink, and the unit exists the set-up mode with previous device settings unchanged.

Refer now to FIG. 9 for a brief description of the circuitry of the module 11. The circuitry includes a microcontroller U1, such as a Motorola 68HC05RC18 that is programmed with a library of IR device codes and control software. The microcontroller is connected and used in a standard manner. Resistors R1, R2 and C3 comprise a delay circuit to ensure a clean reset of the microcontroller U1 when power is first applied, by allowing power at the microcontroller input (Vdd) to stabilizer before the LPRST signal on lead 20 is released to initiate microcontroller initialization. Diode D1 serves to protect the microcontroller against inadvertent application of reverse polarity, as well as blocking external discharge of C1 during periods when no power is applied at the input connector.

As mentioned above, module 11 includes the keys, generally labeled as 16, that form a key matrix of any conventional type, as is standard in remote controls. As oscillator circuit comprising resistor R3, capacitors C4 and C5, and crystal Y1 provides timing control for microcontroller U1. LED1 connected in series with resistor R4 provides visual feedback to the user during set-up, etc. Transistor Q1 and resistors R5, R6 and R7 comprise a driver circuit for IR signals. The output of the driver circuit is connected to an IR LED on the base keyboard unit; any suitable IR LED, may be used. As an alternative, the IR LED may be physically incorporated in the module 11.

While the invention has been particularly shown and described with reference to a particular embodiment thereof it will be understood by those skilled in the art that various changes in form and detail may be made therein without departing from the spirit and scope of the invention.

What is claimed is:

1. A keypad module for use with a wireless computer keyboard having a power source, the module comprising:
   a. a casing adapted to be mounted on the computer keyboard;
   b. a microcontroller in the casing;
   c. a plurality of user activateable inputs for entering information to said microcontroller operably connected to the microcontroller; and
   d. an electrical connection adapted to connect the module to the keyboard and to provide means for communicating with a consumer product via the keyboard.

2. The keypad module of claim 1, wherein said electrical connection comprises a first contact point on said module, wherein the first contact point is mateable with a second contact point on said keyboard.

3. The keypad module of claim 1, wherein said microcontroller communicates with said consumer electronic product by way of an IR LED on said keyboard.

4. The keypad module of claim 1, further including retaining springs extending from the casing of said module and wherein the retaining springs engage said computer keyboard.

5. The keypad module of claim 1, further including means for selectively providing control commands to said consumer electronics product.

6. The keypad module of claim 1, further comprising means for using the module with one of various brands of consumer electronics devices.

7. The keypad module of claim 1, wherein the computer keyboard is a standard wireless computer keyboard.

8. The keypad module of claim 1, wherein the consumer electronics device is selected from the group comprising a television, a video recorder, a cable access interface, and an Internet access interface.

9. The standard keyboard of claim 1, comprising means for providing power to the keypad module from the power source.

10. A wireless keyboard system comprising:
   a. a computer keyboard having a housing with user activateable inputs and an IR LED for communicating with a consumer electronics product;
   b. a module mounted to said computer keyboard and having a microcontroller and a plurality of user activateable inputs; and
   c. an electrical connection connecting said module to said computer keyboard and providing a path for communicating with the consumer product through the keyboard.

11. The keyboard system of claim 10 wherein the computer keyboard housing is molded to accommodate the module.

12. The keyboard system of claim 10 wherein the computer keyboard housing defines a recess and the module is positioned in the recess.

13. The keyboard system of claim 10 wherein the microcontroller communicates with the consumer electronics product by way of an IR LED on the computer keyboard.

14. The system of claim 10, further including programming software for enabling said module to operate as a universal remote control including a setup to access one of a library of various consumer electronics products.

15. The keyboard system of claim 10 further including programming software for enabling said module to operate as a universal remote control including a setup to access one of a library of various brands of consumer electronics products.

* * * * *